US011776585B2

(12) United States Patent
Sung et al.

(10) Patent No.: US 11,776,585 B2
(45) Date of Patent: Oct. 3, 2023

(54) MEMORY DEVICE INCLUDING A PASS TRANSISTOR CIRCUIT AND A DISCHARGE TRANSISTOR CIRCUIT

(71) Applicant: SK hynix Inc., Icheon-si (KR)

(72) Inventors: Sang Hyun Sung, Icheon-si (KR); Jin Ho Kim, Icheon-si (KR); Sung Lae Oh, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 66 days.

(21) Appl. No.: 17/674,829

(22) Filed: Feb. 17, 2022

(65) Prior Publication Data

US 2023/0071992 A1 Mar. 9, 2023

(30) Foreign Application Priority Data

Sep. 8, 2021 (KR) ........................ 10-2021-0119536

(51) Int. Cl.

| | |
|---|---|
| ***G11C 5/06*** | (2006.01) |
| ***G11C 5/02*** | (2006.01) |
| ***G11C 8/08*** | (2006.01) |
| ***G11C 8/12*** | (2006.01) |
| ***G11C 8/10*** | (2006.01) |

(52) U.S. Cl.

CPC .............. *G11C 5/063* (2013.01); *G11C 5/025* (2013.01); *G11C 8/08* (2013.01); *G11C 8/10* (2013.01); *G11C 8/12* (2013.01)

(58) Field of Classification Search

CPC ........... G11C 5/063; G11C 5/025; G11C 8/08; G11C 8/10; G11C 8/12

USPC .......................................................... 365/129

See application file for complete search history.

(56) References Cited

U.S. PATENT DOCUMENTS

2021/0233583 A1* 7/2021 Hirano ............... G11C 13/0004

FOREIGN PATENT DOCUMENTS

KR 10-2021-0147687 A 12/2021

* cited by examiner

*Primary Examiner* — Huan Hoang

(57) ABSTRACT

A memory device includes a pass transistor circuit included in a first wafer, and configured to transfer an operating voltage to row lines of a memory cell array; and a discharge transistor circuit included in a second wafer that overlaps with the first wafer in a vertical direction, and configured to transfer a discharge voltage to at least one of the row lines.

17 Claims, 14 Drawing Sheets

BLK
BL
BL
BL
DSL
DSL
DSL
WL
WL
WL
WL
WL
WL
WL
WL
SSL
SSL
SSL
CSL
CSTR
DST
MC
MC
MC
MC
MC
MC
MC
MC
SST
VD
SD
FD

SD
FD
VD

PASS TR { DSL PASS TR
WL PASS TR (not shown)
SSL PASS TR

GRL { GDSL
GWL (not shown)
GSSL

MEMORY DEVICE INCLUDING A PASS TRANSISTOR CIRCUIT AND A DISCHARGE TRANSISTOR CIRCUIT

CROSS-REFERENCE TO RELATED APPLICATION

The present application claims priority under 35 U.S.C. § 119(a) to Korean Patent Application No. 10-2021-0119536 filed in the Korean Intellectual Property Office on Sep. 8, 2021, which is incorporated herein by reference in its entirety.

BACKGROUND

1. Technical Field

Various embodiments generally relate to a semiconductor technology, and more particularly, to a memory device.

2. Related Art

With the growth of mobile devices such as smart phones and tablets, automobiles, the Internet of Things and artificial intelligence technologies, the demand for memory devices is increasing explosively, and high-capacity and high-performance memory devices are required.

As the memory devices trend toward high capacity and high performance, the number of wiring lines included in each memory device increases and the structure of the wiring lines becomes complicated, while at the same time, a layout area allocated for the disposition of the wiring lines is decreasing due to the miniaturization of the memory device. Thus, an efficient wiring line disposition method is required.

SUMMARY

Various embodiments are directed to providing a memory device capable of improving the efficiency of disposing wiring lines.

In an embodiment, a memory device may include: a pass transistor circuit included in a first wafer, and configured to transfer an operating voltage to row lines of a memory cell array; and a discharge transistor circuit included in a second wafer that overlaps with the first wafer in a vertical direction, and configured to transfer a discharge voltage to at least one of the row lines.

In an embodiment, a memory device may include: a pass transistor circuit included in a first wafer, and coupled to row lines of a memory cell array; and a discharge transistor circuit included in a second wafer that overlaps with the first wafer in a vertical direction and is coupled to the pass transistor circuit through at least one discharge line.

DETAILED DESCRIPTION

Figure 1:
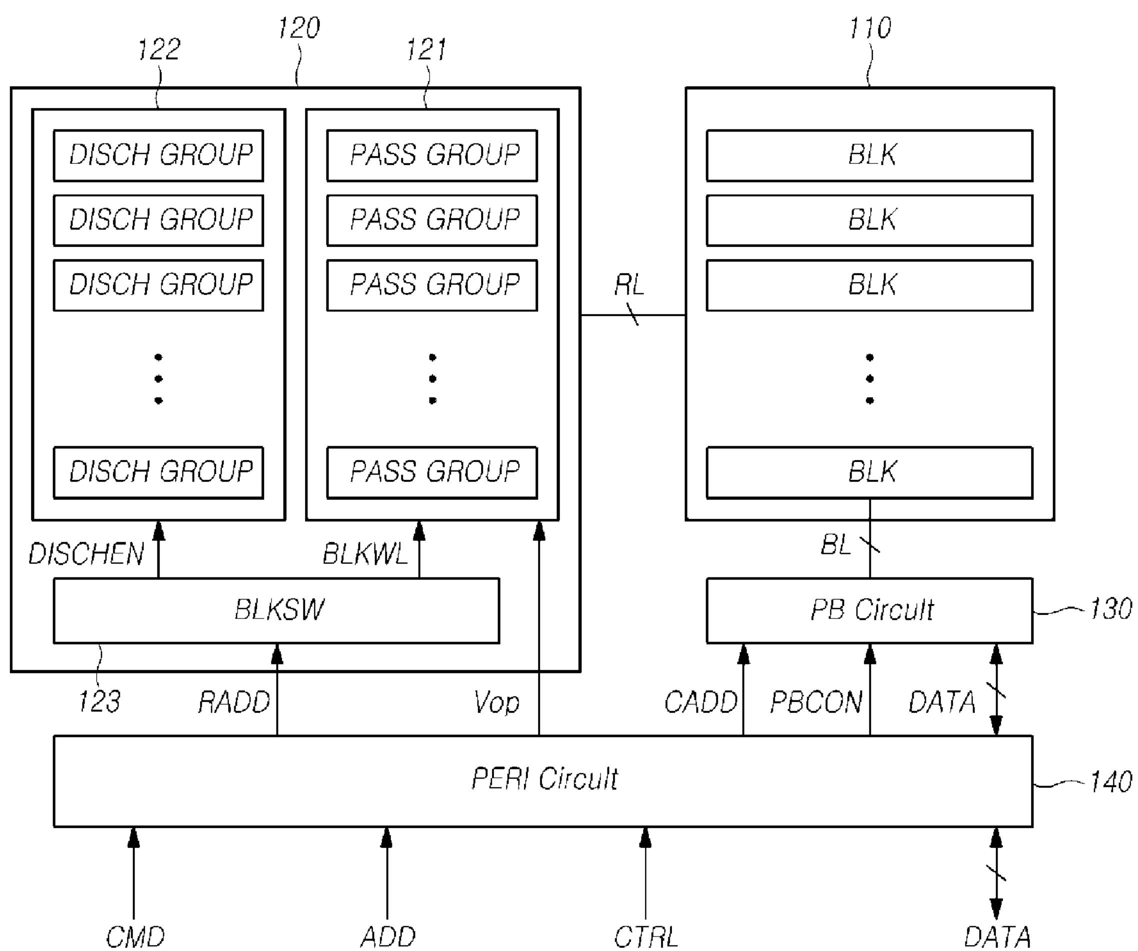
FIG. 1 is a block diagram of a memory device in accordance with an embodiment of the present disclosure.

Advantages and features of the disclosure and methods to achieve them will become apparent from the descriptions of exemplary embodiments herein below and described with reference to the accompanying drawings. However, the present disclosure is not limited to the exemplary embodiments disclosed herein but may be implemented in various different ways. The exemplary embodiments of the present disclosure convey the scope of the disclosure to those skilled in the art.

The figures, dimensions, ratios, angles, numbers of elements given in the drawings that describe embodiments of the disclosure are merely illustrative and are not limiting. Throughout the specification, like reference numerals refer to like elements. In describing the disclosure, when it is determined that a detailed description of the known related art may obscure the gist or clarity of the disclosure, the detailed description thereof will be omitted. It is to be understood that the terms “comprising,” “having,” “including” and so on, used in the description and claims, should not be interpreted as being restricted to the means listed thereafter unless specifically stated otherwise. Where an indefinite or definite article is used when referring to a singular noun (e.g. “a,” “an,” “the”), the article may include a plural of that noun unless specifically stated otherwise. In interpreting elements in embodiments of the disclosure, they should be interpreted as including error margins even in the absence of explicit statements.

Also, in describing the components of the disclosure, there may be terms used like first, second, A, B, (a), and (b). These are solely for the purpose of differentiating one component from the other and do not to imply or suggest the substances, order, sequence or number of the components. Also, elements in embodiments of the disclosure are not limited by these terms. These terms are used to merely distinguish one element from another. Accordingly, as used herein, a first element may be a second element within the technical idea of the disclosure.

If a component is described as “connected,” “coupled” or “linked” to another component, it may mean that the component is not only directly “connected,” “coupled” or “linked” but also is indirectly “connected,” “coupled” or “linked” via a third component. In describing positional relationship, such as “an element A on an element B,” “an element A above an element B,” “an element A below an element B” and “an element A next to an element B,”

another element C may be disposed between the elements A and B unless the term “directly” or “immediately” is explicitly used.

Features of various exemplary embodiments of the disclosure may be coupled, combined or separated partially or totally. Technically various interactions and operations are possible. Various exemplary embodiments can be practiced individually or in combination.

FIG. 1 is a block diagram of a memory device in accordance with an embodiment of the present disclosure.

Referring to FIG. 1, a memory device 100 in accordance with an embodiment of the present disclosure may include a memory cell array 110, a row decoder 120, a page buffer circuit 130 and a peripheral circuit (PERI Circuit) 140.

The memory cell array 110 may be coupled to the row decoder 120 through a plurality of row lines RL, and may be coupled to the page buffer circuit 130 through a plurality of bit lines BL. The plurality of row lines RL may include a plurality of drain select lines, a plurality of word lines and a plurality of source select lines (not illustrated).

The memory cell array 110 may include a plurality of memory blocks BLK. Although not illustrated, each memory block BLK may include a plurality of pages. The memory block BLK may be a basic unit of an erase operation, and the page may be a basic unit of a read operation.

Although not illustrated, the memory cell array 110 may include a plurality of memory cells, which are disposed in regions where the plurality of bit lines BL and the plurality of word lines intersect. The memory cell may be a volatile memory cell, which loses data stored therein when power supply is interrupted, or may be a nonvolatile memory cell that retains data stored therein even when power supply is cut off. For example, when the memory cell is a volatile memory cell, the memory device 100 may be a DRAM (dynamic random access memory), an SRAM (static random access memory), a mobile DRAM, a DDR SDRAM (double data rate synchronous dynamic random access memory), an LPDDR (low power DDR) SDRAM, a GDDR (graphic DDR) SDRAM or an RDRAM (Rambus dynamic random access memory). When the memory cell is a nonvolatile memory cell, the memory device 100 may be for example an EEPROM (electrically erasable programmable read-only memory), a flash memory, a PRAM (phase change random access memory), an RRAM (resistive random access memory), an NFGM (nano-floating gate memory), a PoRAM (polymer random access memory), an MRAM (magnetic random access memory) or an FRAM (ferroelectric random access memory). The memory device 100 may be a hybrid memory in which the memory cell array 110 includes both volatile memory cells and nonvolatile memory cells.

The memory cell may be a single level cell (SLC) that stores one-bit data or a multi-level cell (MLC) that stores two or more-bit data. The multi-level cell may store two-bit data, three-bit data, four-bit data, and so forth. The memory cell array 110 may include at least one of a single level cell and a multi-level cell.

The row decoder 120 may include a pass transistor circuit 121, a discharge transistor circuit 122 and a block selection circuit (BLKSW) 123.

The pass transistor circuit 121 may include a plurality of pass transistor groups PASS GROUP corresponding to the plurality of memory blocks BLK, respectively. Each pass transistor group PASS GROUP may be coupled to the row lines RL of a corresponding memory block BLK. One of the plurality of pass transistor groups PASS GROUP may be selected in response to a block selection signal BLKWL from the block selection circuit (BLKSW) 123, and the selected pass transistor group PASS GROUP may transfer an operating voltage Vop, from the peripheral circuit (PERI Circuit) 140, to the row lines RL of a corresponding memory block BLK.

The discharge transistor circuit 122 may include a plurality of discharge transistor groups DISCH GROUP corresponding to the plurality of memory blocks BLK, respectively. Each discharge transistor group DISCH GROUP may be coupled to at least one of the row lines RL of a corresponding memory block BLK, and may discharge the row line RL. For example, the discharge transistor group DISCH GROUP may be coupled to the drain select line and the source select line of the corresponding memory block BLK, may transfer, when the corresponding memory block BLK is unselected, a ground voltage to the drain select line and the source select line of the corresponding memory block BLK in response to a discharge enable signal DISCHEN received from the block selection circuit (BLKSW) 123, and accordingly, the drain select line and the source select line may be discharged.

The block selection circuit (BLKSW) 123 may generate the block selection signal BLKWL and the discharge enable signal DISCHEN in response to a row address signal RADD from the peripheral circuit (PERI Circuit) 140, may provide the block selection signal BLKWL to the pass transistor circuit 121, and may provide the discharge enable signal DISCHEN to the discharge transistor circuit 122.

The page buffer circuit 130 may be coupled to the memory cell array 110 through the plurality of bit lines BL. The page buffer circuit 130 may receive a page buffer control signal PBCON from the peripheral circuit (PERI Circuit) 140, and may transmit and receive a data signal DATA to and from the peripheral circuit (PERI Circuit) 140.

The page buffer circuit 130 may control the bit lines BL, which are coupled to the memory cell array 110, in response to the page buffer control signal PBCON. For example, the page buffer circuit 130 may detect data, stored in a memory cell of the memory cell array 110, by sensing the signal of a bit line BL of the memory cell array 110 in response to the page buffer control signal PBCON, and may transmit the data signal DATA to the peripheral circuit (PERI Circuit) 140 according to the detected data. The page buffer circuit 130 may apply a signal to a bit line BL on the basis of the data signal DATA received from the peripheral circuit (PERI Circuit) 140 in response to the page buffer control signal PBCON, and accordingly, may write data to a memory cell of the memory cell array 110. The page buffer circuit 130 may write data to or read data from a memory cell that is coupled to a word line activated by the row decoder 120.

The peripheral circuit (PERI Circuit) 140 may receive a command signal CMD, an address signal ADD and a control signal CTRL from a device outside of the memory device 100, for example, a memory controller, and may transmit and receive data DATA to and from the external device. The peripheral circuit (PERI Circuit) 140 may output signals for writing data to the memory cell array 110 or reading data from the memory cell array 110, for example, the row address signal RADD, a column address signal CADD, the page buffer control signal PBCON and so forth, on the basis of the command signal CMD, the address signal ADD and the control signal CTRL. The peripheral circuit (PERI Circuit) 140 may generate various voltages, including the operating voltage Vop, which are required in the memory device 100. For example, the peripheral circuit (PERI Circuit) 140 may generate program voltages, pass voltages, read voltages and erase voltages of various levels.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. For example, the first direction FD may be the extending direction of row lines and the arrangement direction of bit lines, and the second direction SD may be the extending direction of the bit lines and the arrangement direction of the row lines. The first direction FD and the second direction SD may substantially perpendicularly intersect with each other. In the drawings, a direction indicated by an arrow and a direction opposite thereto indicate the same direction.

Figure 2:
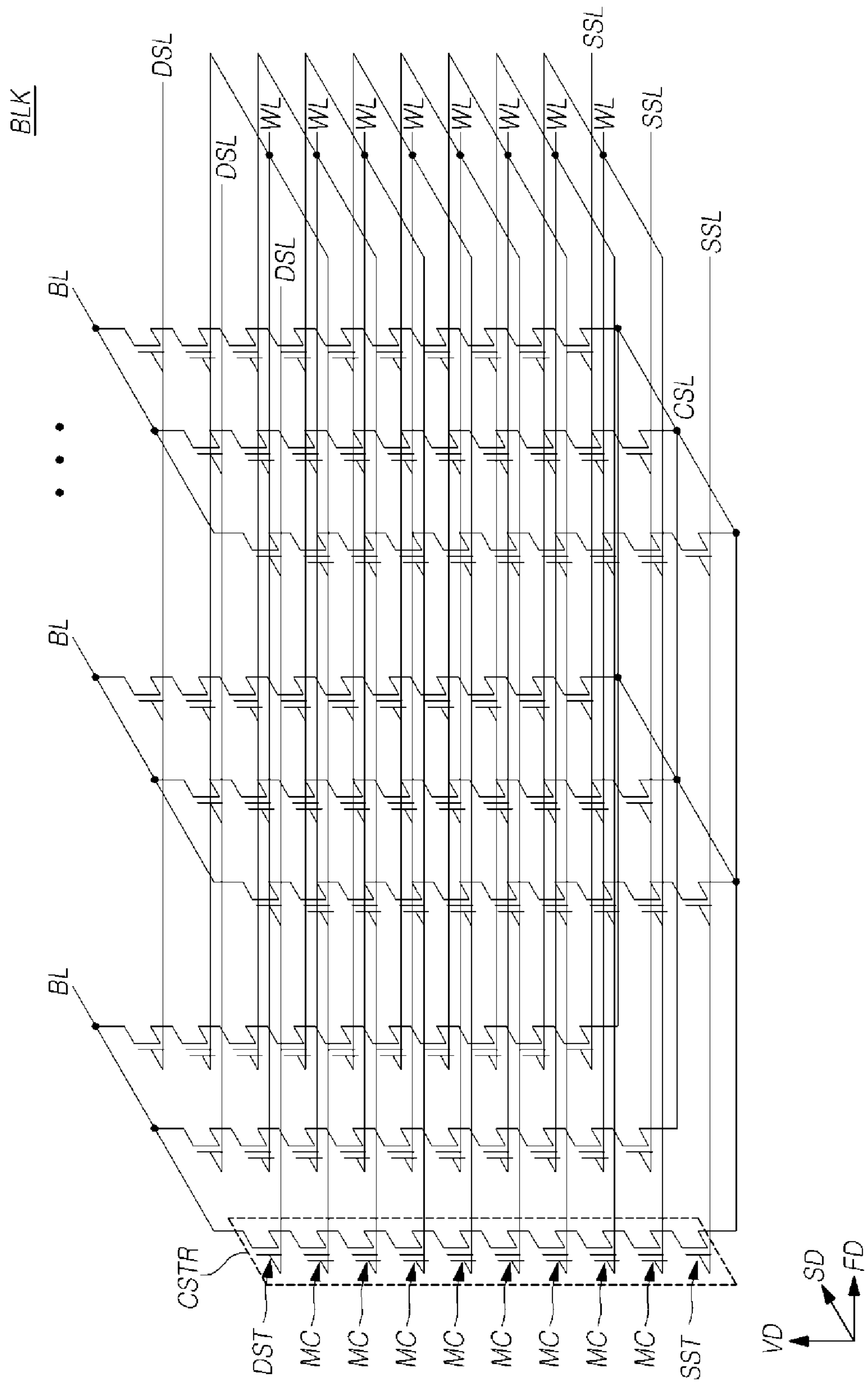
FIG. 2 is an exemplary circuit diagram of a memory block of FIG. 1.

FIG. 2 is an exemplary circuit diagram of a memory block of FIG. 1.

Referring to FIG. 2, a memory block BLK may include a plurality of cell strings CSTR, which are coupled between a plurality of bit lines BL and a common source line CSL. A plurality of cell strings CSTR may be coupled in parallel to each bit line BL. The cell strings CSTR may be coupled in common to the common source line CSL. The plurality of cell strings CSTR may be coupled between the plurality of bit lines BL and the one common source line CSL.

Each cell string CSTR may include a drain select transistor DST that is coupled to a bit line BL, a source select transistor SST that is coupled to the common source line CSL, and a plurality of memory cells MC that are coupled between the drain select transistor DST and the source select transistor SST. The drain select transistor DST, the memory cells MC and the source select transistor SST may be coupled in series in the vertical direction VD.

Source select lines SSL, a plurality of word lines WL and drain select lines DSL may be stacked in the vertical direction VD between the common source line CSL and the bit lines BL. The drain select lines DSL may be coupled to the gates of corresponding drain select transistors DST. The source select lines SSL may be coupled to the gates of corresponding source select transistors SST. The word lines WL may be coupled to the gates of corresponding memory cells MC. Memory cells MC that are coupled in common to one word line WL may configure one page.

Figure 3:
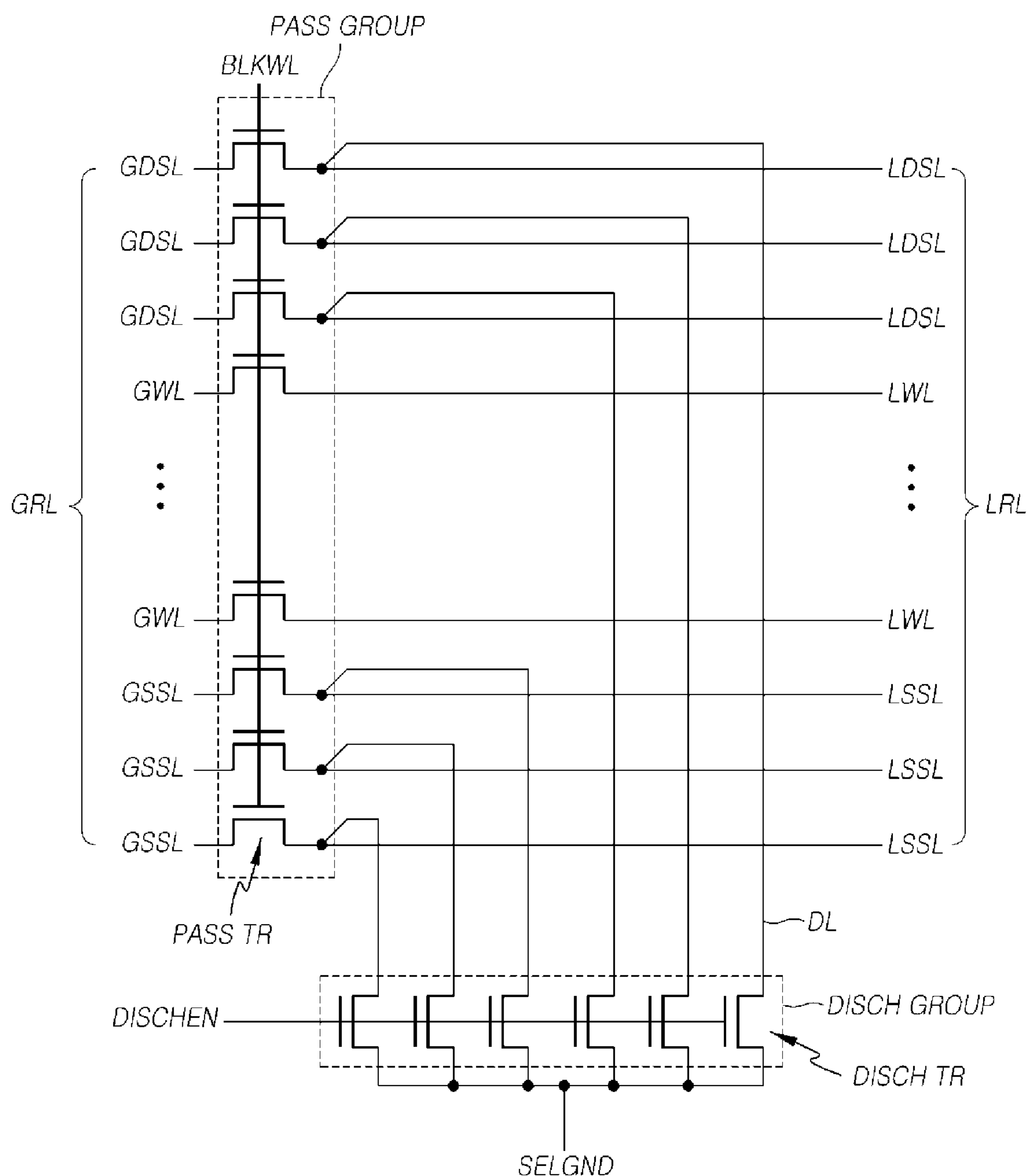
FIG. 3 is an exemplary circuit diagram of a pass transistor group and a discharge transistor group of FIG. 1.

FIG. 3 is an exemplary circuit diagram of a pass transistor group and a discharge transistor group of FIG. 1.

Referring to FIG. 3, a pass transistor group PASS GROUP may include a plurality of pass transistors PASS TR. The drains of the pass transistors PASS TR may be coupled to global row lines GRL, respectively. The global row lines GRL may include at least one global drain select line GDSL, a plurality of global word lines GWL and at least one global source select line GSSL. The sources of the pass transistors PASS TR may be coupled to local row lines LRL, respectively, and may be coupled to the row lines (not illustrated) through the local row lines LRL.

The pass transistors PASS TR included in a single pass transistor group PASS GROUP may be turned on or off all at once in response to the block selection signal BLKWL. For example, when the block selection signal BLKWL is activated to a high level, all the pass transistors PASS TR included in the pass transistor group PASS GROUP may be turned on in response to the activated block selection signal BLKWL. Accordingly, operating voltages loaded on the global row lines GRL may be transferred to the local row lines LRL through the pass transistors PASS TR, and may be transferred to the row lines RL of a corresponding memory block BLK through the local row lines LRL.

A discharge transistor group DISCH GROUP may include a plurality of discharge transistors DISCH TR. The source of each discharge transistor DISCH TR may be coupled to the source of a corresponding pass transistor PASS TR through a discharge line DL. The source of the discharge transistor DISCH TR and the source of the pass transistor PASS TR may be coupled in common to one of local drain select lines LDSL or one of local source select lines LSSL from among a plurality of local row lines LRL, and as a result the source of the discharge transistor DISCH TR may be coupled in common to one row line through the local row line LRL.

The drains of the discharge transistors DISCH TR may be coupled in common to a selection node SELGND. A ground voltage may be loaded on the selection node SELGND.

The discharge transistors DISCH TR included in the discharge transistor group DISCH GROUP may be turned on or off all at once in response to the discharge enable signal DISCHEN. For example, when the discharge enable signal DISCHEN is activated to a high level, the discharge transistors DISCH TR included in the discharge transistor group DISCH GROUP may be turned on all at once in response to the activated discharge enable signal DISCHEN. Accordingly, the ground voltage loaded on the selection node SELGND may be transferred to the local drain select lines LDSL and the local source select lines LSSL through the discharge transistors DISCH TR, and may be transferred to the drain select lines DSL and the source select lines SSL of a corresponding memory block BLK through the local drain select lines LDSL and the local source select lines LSSL. Accordingly, the drain select lines DSL and the source select lines SSL of the corresponding memory block BLK may be discharged.

As described above, since many wiring lines such as the plurality of global row lines GRL, the plurality of local row lines LRL and the plurality of discharge lines DL are coupled to the pass transistor group PASS GROUP, the number of wiring lines to be disposed on the pass transistor group PASS GROUP is large and thus, it may be difficult to dispose the wiring lines without adverse impacts.

When a layout area allocated to the pass transistor group PASS GROUP is increased, it may be possible to dispose the wiring lines, but this solution is inappropriate with the miniaturization of the memory device 100. On the other hand, if the number of wiring layers is increased, then it is possible to dispose the wiring lines even without increasing a layout area. However, in this case, as the number of process steps increases, a manufacturing time and a manufacturing cost increase, and the probability of failures occurring during a manufacturing process increases.

Embodiments of the present disclosure may suggest measures for enabling the disposition of wiring lines by increasing the efficiency of disposing wiring lines, without increasing the layout area or the number of wiring layers.

Figure 4:
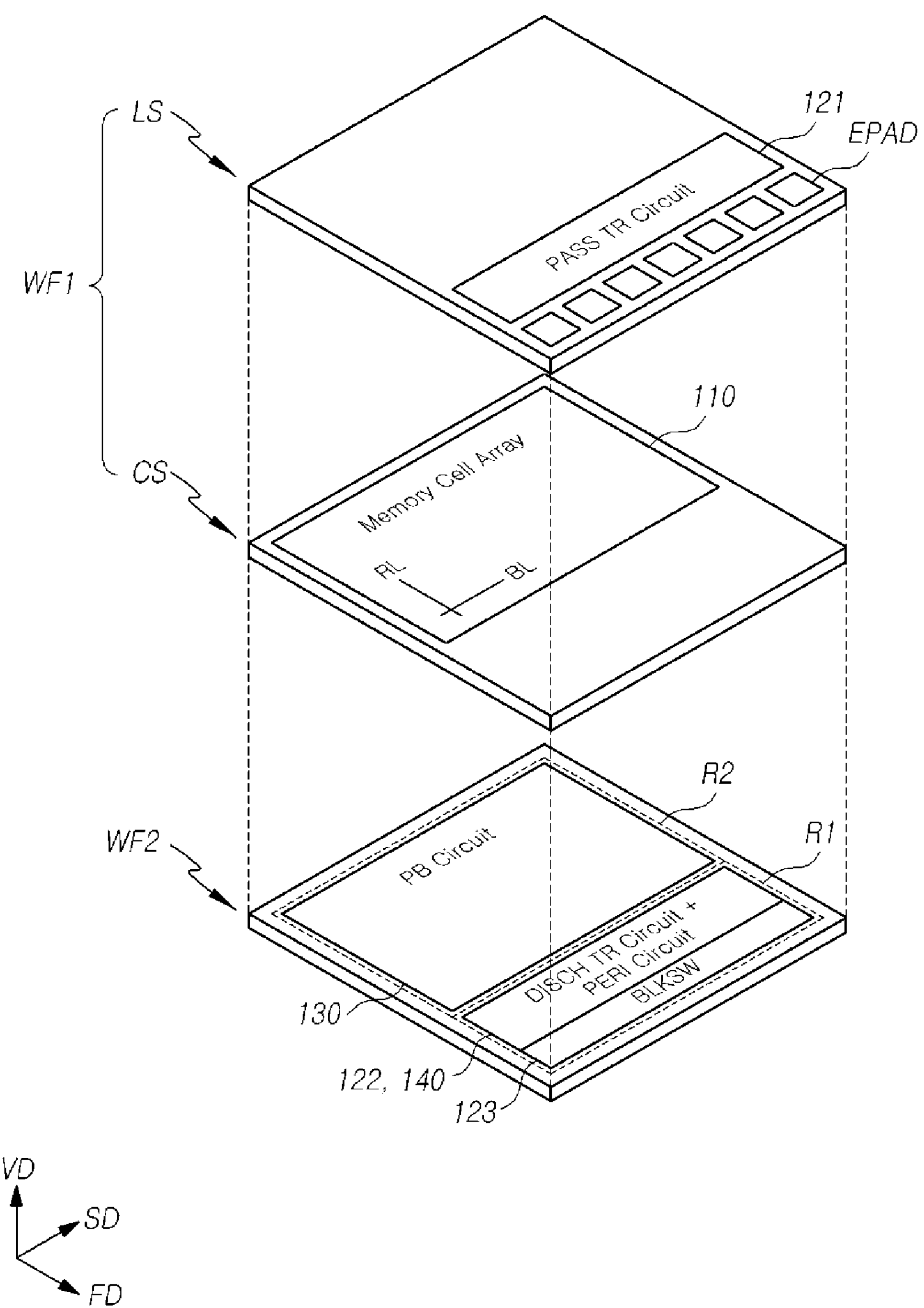
FIG. 4 is a diagram illustrating a schematic layout of a memory device in accordance with an embodiment of the present disclosure.
Figure 5:
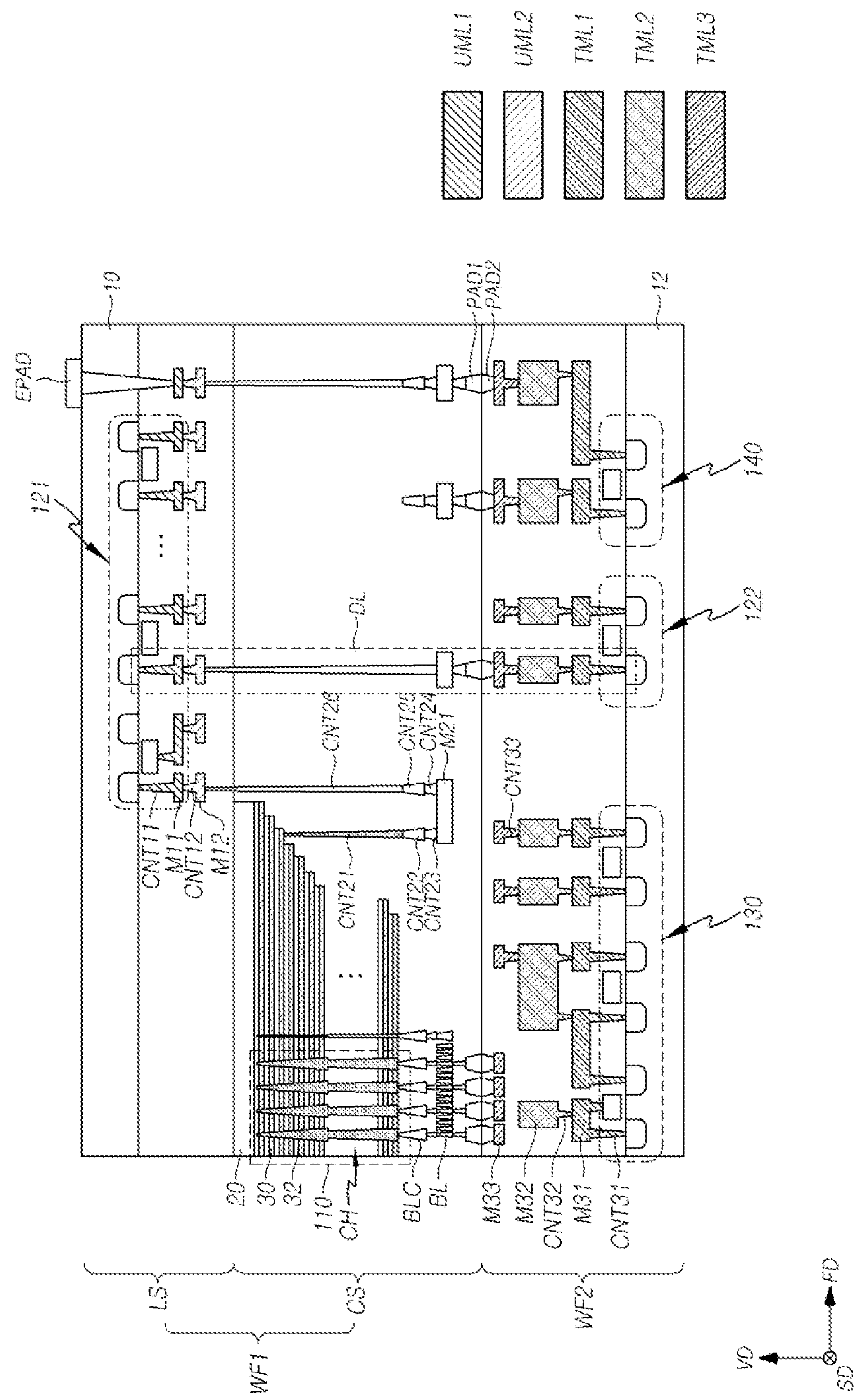
FIG. 5 is an exemplary cross-sectional view of the memory device illustrated in FIG. 4.
Figure 6:
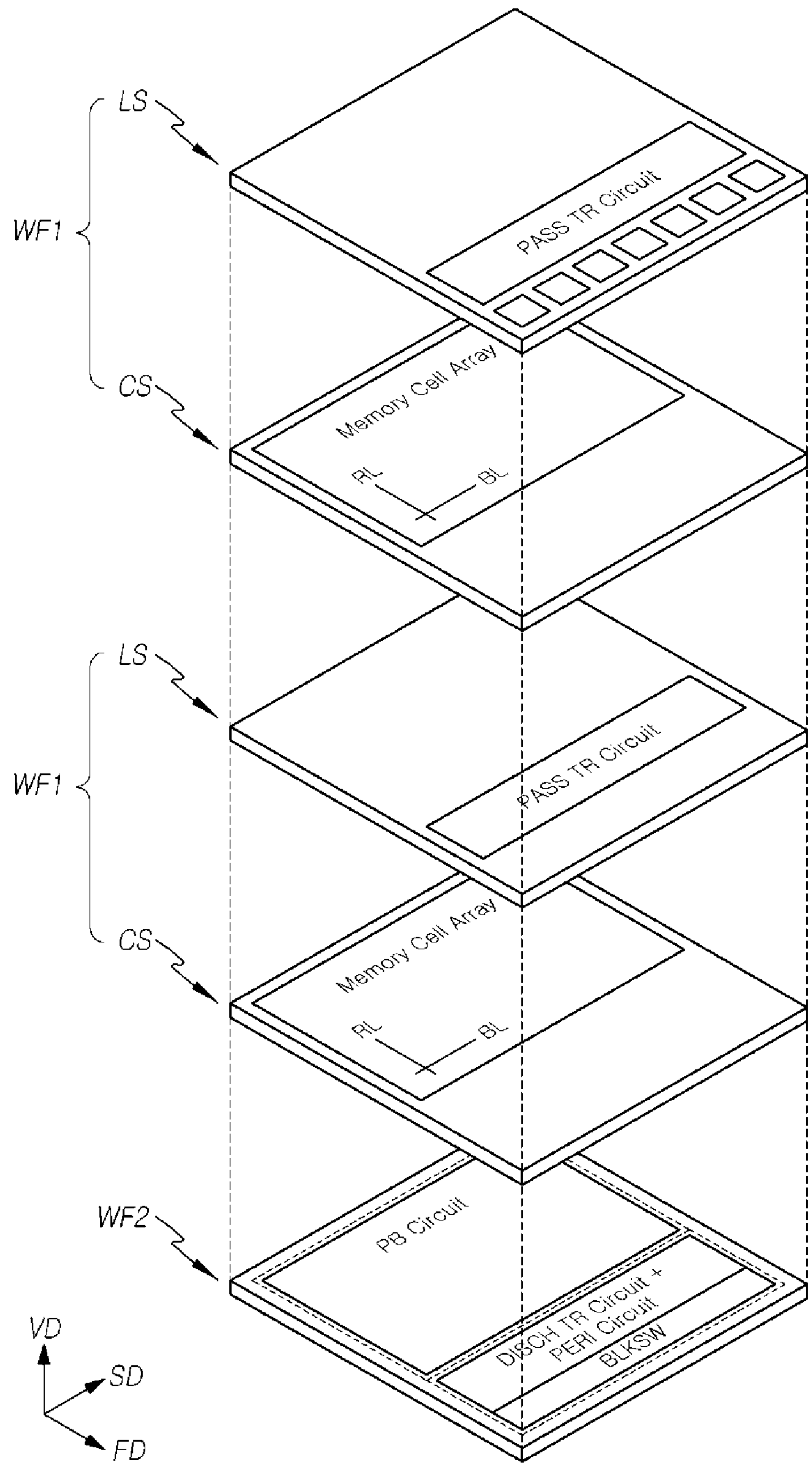
FIGS. 6 and 7 are diagrams illustrating schematic layouts of memory devices in accordance with other embodiments of the present disclosure.
Figure 7:
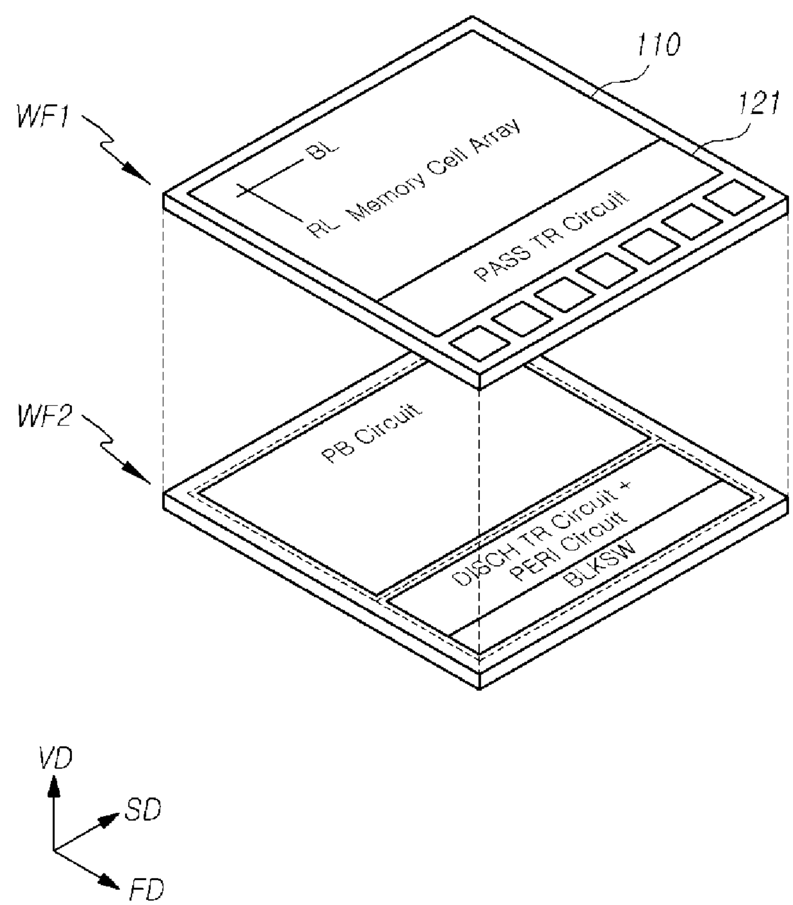

FIG. 4 is a diagram illustrating a schematic layout of a memory device in accordance with an embodiment of the present disclosure, FIG. 5 is an exemplary cross-sectional view of the memory device illustrated in FIG. 4, and FIGS. 6 and 7 are diagrams illustrating schematic layouts of memory devices in accordance with other embodiments of the present disclosure.

Referring to FIG. 4, a memory device in accordance with an embodiment of the present disclosure may include a first wafer WF1 and a second wafer WF2, which is disposed under the first wafer WF1. The first wafer WF1 and the second wafer WF2 may be bonded to each other by a bonding technique. The first wafer WF1 may include a logic structure LS and a cell structure CS, which is disposed under the logic structure LS.

In order to facilitate understanding, FIG. 4 is an exploded view that illustrates the bottom surface of the logic structure LS and the top surface of the cell structure CS as separated from each other, and the bottom surface of the first wafer WF1 and the top surface of the second wafer WF2 as separated from each other. However, it should be understood that the bottom surface of the logic structure LS and the top surface of the cell structure CS are in contact with each other and that the bottom surface of the first wafer WF1 and the top surface of the second wafer WF2 are in contact with each other.

A pass transistor circuit 121 may be disposed in the logic structure LS. A memory cell array 110 may be disposed in the cell structure CS. A discharge transistor circuit 122 may be disposed in the second wafer WF2. In addition, a block selection circuit 123, a page buffer circuit 130 and a peripheral circuit 140 may be disposed in the second wafer WF2 together with the discharge transistor circuit 122.

From a top view in the vertical direction, the pass transistor circuit 121 may be configured to be adjacent to the memory cell array 110 in the first direction FD and have a shape that extends in the second direction SD, which is the direction in which row lines RL are arranged.

The first wafer WF1 may include a plurality of external coupling pads EPAD. The external coupling pads EPAD may be disposed in a line adjacent to an edge of the top surface of the first wafer WF1. Through the plurality of external coupling pads EPAD, the memory device may receive electrical signals, for example, a command signal, an address signal and a control signal, from an external device such as a memory controller, and may exchange data with the external device.

The second wafer WF2 may include a first region R1, which overlaps with the pass transistor circuit 121 in the vertical direction VD, and a second region R2 that overlaps with the memory cell array 110 in the vertical direction VD.

The discharge transistor circuit 122 may be disposed in the first region R1 of the second wafer WF2. The block selection circuit 123 and the peripheral circuit 140 may also be disposed in the first region R1 of the second wafer WF2. In an embodiment, the discharge transistor circuit 122, the block selection circuit 123 and the peripheral circuit 140 may overlap with the pass transistor circuit 121 in the vertical direction VD.

The discharge transistor circuit 122 and the peripheral circuit 140 may be disposed at one edge of the first region R1 that is adjacent to the second region R2. The block selection circuit 123 may be disposed at a position separated from the second region R2 with the discharge transistor circuit 122 and the peripheral circuit 140 interposed therebetween. Therefore, the discharge transistor circuit 122 may disposed closer in the first direction to the page buffer circuit 130 than the block selection circuit 123.

The page buffer circuit 130 may be disposed in the second region R2 of the second wafer WF2. Accordingly, the page buffer circuit 130 may overlap with the memory cell array 110 in the vertical direction VD.

While FIG. 4 illustrates the second wafer WF2 as disposed under the first wafer WF1, and the cell structure CS as disposed under the logic structure LS, the present disclosure is not limited thereto. For example, the second wafer WF2 may be disposed on the first wafer WF1, and the cell structure CS may be disposed on the logic structure LS.

Referring to FIG. 5, the first wafer WF1 may include a first substrate 10, and the second wafer WF2 may include a second substrate 12.

Each of the first substrate 10 and the second substrate 12 may be a single crystal semiconductor layer. For example, each of the first substrate 10 and the second substrate 12 may be a bulk silicon substrate, a silicon-on-insulator substrate, a germanium substrate, a germanium-on-insulator substrate, a silicon-germanium substrate, or an epitaxial thin film formed through selective epitaxial growth.

The logic structure LS may include the pass transistor circuit 121 and first and second wiring layers UML1 and UML2, which are defined under the first substrate 10. The pass transistor circuit 121 may be coupled to wiring lines M11 in the first wiring layer UML1 through contacts CNT11 and to wiring lines M12 in the second wiring layer UML2 through contacts CNT12. The first and second wiring layers UML1 and UML2 may be formed of a metallic material, for example, tungsten (W), aluminum (Al) or copper (Cu).

The cell structure CS may include a source plate 20 that is disposed under the logic structure LS, a plurality of electrode layers 30 and a plurality of interlayer dielectric layers 32 which are alternately stacked under the source plate 20. A plurality of vertical channels CH may pass through the plurality of electrode layers 30 and the plurality of interlayer dielectric layers 32 in the vertical direction VD to extend to the source plate 20.

The source plate 20 may include a semiconductor material, for example, a group IV semiconductor, a group III-V compound semiconductor or a group II-VI compound semiconductor. For example, the group IV semiconductor may include silicon, germanium or silicon-germanium. For example, the source plate 20 may be provided as a polycrystalline layer or an epitaxial layer.

The electrode layers 30 may include a conductive material. For example, the electrode layers 30 may include at least one selected among a doped semiconductor (e.g., doped silicon), a metal (e.g., tungsten, copper or aluminum), a conductive metal nitride (e.g., titanium nitride or tantalum nitride) and a transition metal (e.g., titanium or tantalum). The electrode layers 30 may configure row lines. In further detail, among the electrode layers 30, at least one electrode layer 30 from the uppermost electrode layer 30 may configure a source select line. Among the electrode layers 30, at least one electrode layer 30 from the lowermost electrode layer 30 may configure a drain select line. The electrode layers 30 between the source select line and the drain select line may configure word lines. The interlayer dielectric layers 32 may include silicon oxide.

Each of the electrode layers 30 may be coupled to the wiring line M12 of the logic structure LS through contacts CNT21 to CNT26 and a wiring line M21, and may be coupled to the pass transistor circuit 121 through the contacts CNT11 and CNT12 and the wiring line M11, which are coupled to the wiring line M12.

Although not illustrated in detail, each of the vertical channels CH may include a channel layer and a gate dielectric layer. The channel layer may include polysilicon or monocrystalline silicon, and may include, in some regions thereof, a p-type impurity such as boron (B). The gate dielectric layer may have a shape that surrounds the outer wall of the channel layer. The gate dielectric layer may include a tunnel dielectric layer, a charge storage layer and a blocking layer that are sequentially stacked from the outer wall of the channel layer. In some embodiments, the gate dielectric layer may have an ONO (oxide-nitride-oxide) stack structure in which an oxide layer, a nitride layer and an oxide layer are sequentially stacked. A source select transistor may be configured in areas or regions where the source select line surrounds the vertical channel CH. Memory cells may be configured in areas or regions where the word lines surround the vertical channel CH. A drain select transistor may be configured in areas or regions where the drain select line surrounds the vertical channel CH. The source select transistor, the plurality of memory cells and the drain select transistor disposed along one vertical channel CH may configure one cell string. The memory cell array 110 may include a plurality of cell strings corresponding to the plurality of vertical channels CH. Each of the vertical channels CH may be coupled to a corresponding bit line BL through a bit line contact BLC.

As described above with reference to FIG. 4, the first wafer WF1 may include the external coupling pads EPAD on the top surface thereof. The first wafer WF1 may include a plurality of first bonding pads PAD1 on the bottom surface thereof, and the bottom surface of the first wafer WF1 may be bonded to the second wafer WF2. Each of the first bonding pads PAD1 may be coupled to one of the bit lines BL, the pass transistor circuit 121 and the external coupled pads EPAD.

The second wafer WF2 may include the discharge transistor circuit 122, the page buffer circuit 130, the peripheral circuit 140 and third, fourth and fifth wiring layers TML1, TML2 and TML3, which are defined on the second substrate 12. The discharge transistor circuit 122, the page buffer circuit 130 and the peripheral circuit 140 may be coupled to wiring lines M31 defined in the third wiring layer TML1 through contacts CNT31, wiring lines M32 defined in the fourth wiring layer TML2 through contacts CNT32, and wiring lines M33 defined in the fifth wiring layer TML3 through contacts CNT33.

The second wafer WF2 may include a plurality of second bonding pads PAD2 on the top surface thereof which is bonded to the first wafer WF1. The discharge transistor circuit 122, the page buffer circuit 130 and the peripheral circuit 140 may be coupled to the second bonding pads PAD2 through the contacts CNT31, CNT32 and CNT33 and the wiring lines M31, M32 and M33.

Each of the plurality of second bonding pads PAD2 may be bonded to a corresponding first bonding pad PAD1. Accordingly, discharge lines DL may be configured as electrical paths that couple the external coupling pads EPAD and the peripheral circuit 140, that couple bit lines BL and the page buffer circuit 130, and that couple the pass transistor circuit 121 and the discharge transistor circuit 122. As illustrated in FIG. 5, in the present embodiment, components that configure the discharge lines DL may be aligned in the vertical direction VD, and the discharge lines DL may be routed in the vertical direction VD.

As described above, by disposing the pass transistor circuit 121 in the first wafer WF1 and disposing the discharge transistor circuit 122 in the second wafer WF2, the circuits may overlap in the vertical direction VD. As a result, it is possible to configure the discharge lines DL, which couple the pass transistor circuit 121 and the discharge transistor circuit 122, to have a structure that is routed or substantially routed in a direction parallel to the vertical direction VD.

While the embodiment described above with reference to FIGS. 4 and 5 illustrates that one first wafer WF1 is stacked on the second wafer WF2, the present disclosure is not limited thereto. The number of first wafers WF1 stacked on the second wafer WF2 may be two as illustrated in FIG. 6, or may be three or more (not illustrated).

In the meantime, while the embodiments described above with reference to FIGS. 4 to 6 illustrate that the pass transistor circuit 121 is disposed in the logic structure LS, and the memory cell array 110 is disposed in the cell structure CS in a manner to overlap in the vertical direction VD with the logic structure LS, the present disclosure is not limited thereto. As illustrated in FIG. 7, the pass transistor circuit 121 and the memory cell array 110 may be disposed adjacent to each other in a single structure such as first wafer WF1.

Figure 8:
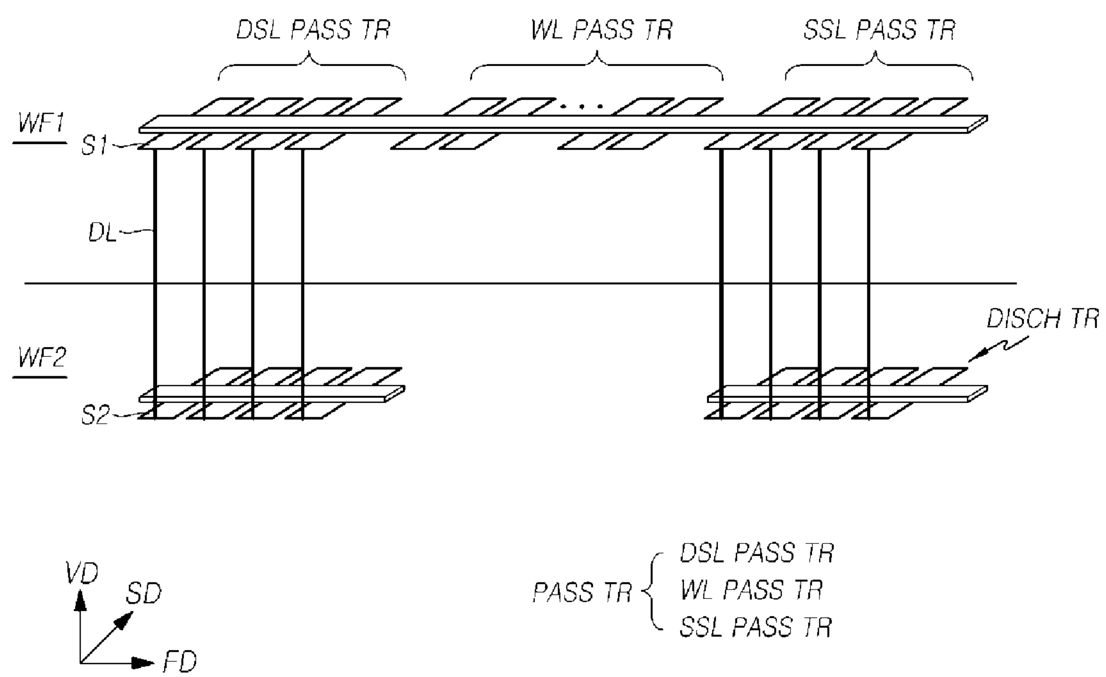
FIG. 8 is a diagram illustrating a schematic layout of pass transistors and discharge transistors of a memory device in accordance with an embodiment of the present disclosure.

FIG. 8 is a diagram illustrating a schematic layout of pass transistors and discharge transistors of a memory device in accordance with an embodiment of the present disclosure. In FIG. 8, the pass transistors PASS TR are included in one pass transistor group and the discharge transistors DISCH TR are included in one discharge transistor group.

In FIG. 8, DSL PASS TR denotes pass transistors that are coupled to drain select lines, SSL PASS TR denotes pass transistors that are coupled to source select lines, and WL PASS TR denotes pass transistors that are coupled to word lines. For the sake of convenience in explanation, hereinafter, DSL PASS TR and SSL PASS TR will be defined as first pass transistors, and WL PASS TR will be defined as second pass transistors.

The discharge transistors DISCH TR may correspond to the first pass transistors DSL PASS TR and SSL PASS TR, respectively. Each of the discharge transistors DISCH TR may be disposed to overlap with a corresponding first pass transistor (one of DSL PASS TR and SSL PASS TR) in the vertical direction VD. A source region S2 of each discharge transistor DISCH TR and a source region S1 of a corresponding first pass transistor (one of DSL PASS TR and SSL PASS TR) may overlap with each other in the vertical direction VD.

The source region S1 of the first pass transistor (one of DSL PASS TR and SSL PASS TR) and the source region S2 of the discharge transistor DISCH TR, which overlap with each other in the vertical direction VD, may be coupled to each other through a discharge line DL. By disposing the source region S1 of the first pass transistor (one of DSL PASS TR and SSL PASS TR) and the source region S2 of the discharge transistor DISCH TR to overlap with each other in the vertical direction VD, the discharge line DL that couples the source regions may be configured to have a length that is the shortest distance between the source region S1 of the first pass transistor (one of DSL PASS TR and SSL PASS TR) and the source region S2 of the discharge transistor DISCH TR. For example, discharge line DL may be a straight line parallel to the vertical direction VD.

Figure 9:
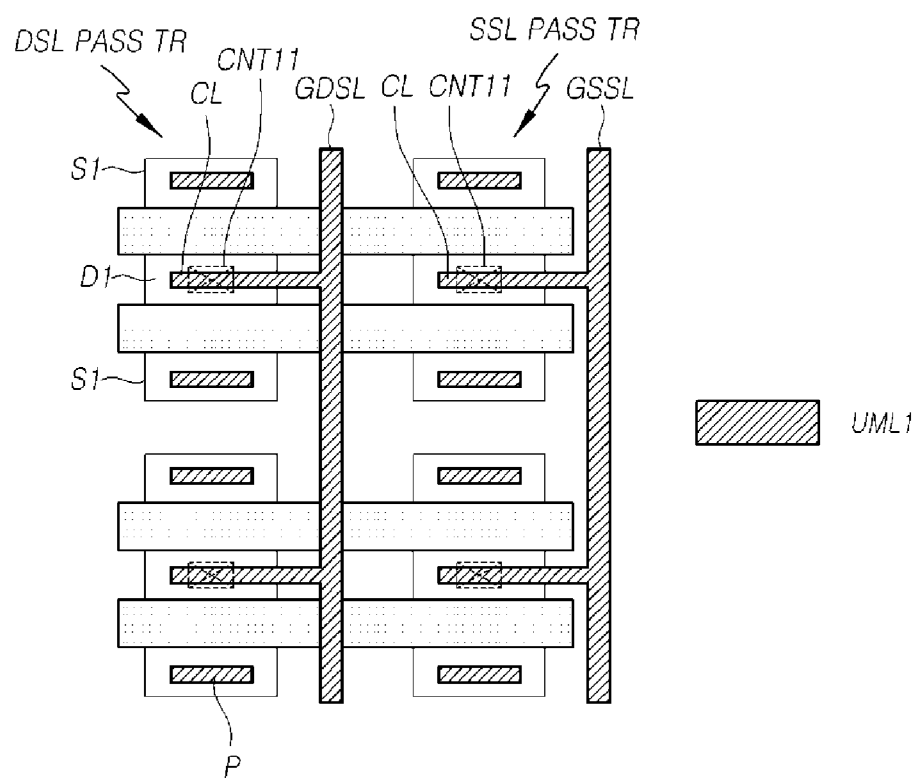
FIG. 9 is a layout diagram illustrating first pass transistors and a first wiring layer of a memory device in accordance with an embodiment of the present disclosure.

FIG. 9 is a layout diagram illustrating first pass transistors and a first wiring layer of a memory device in accordance with an embodiment of the present disclosure.

Referring to FIG. 9, global row lines GRL, coupling lines CL and pad portions P of discharge lines are disposed at the first wiring layer UML1. For the sake of simplicity in illustration, FIG. 9 illustrates only the global drain select line GDSL and the global source select line GSSL from among the global row lines GRL. However, it should be understood that the global word lines GWL may also be disposed at the first wiring layer UML1.

The pad portion P indicates a component that is positioned at the first wiring layer UML1 from among components configuring the discharge line DL (see FIG. 5), and may be aligned on the source region S1 of a corresponding first pass transistor (e.g., one of DSL PASS TR and SSL PASS TR).

The global drain select line GDSL and the global source select line GSSL are disposed to not overlap with the pass transistors PASS TR in the vertical direction VD. Instead, the global drain select line GDSL and the global source select line GSSL may be coupled to corresponding first pass transistors DSL PASS TR and SSL PASS TR, respectively, through the coupling lines CL and the contacts CNT11.

Figure 10:
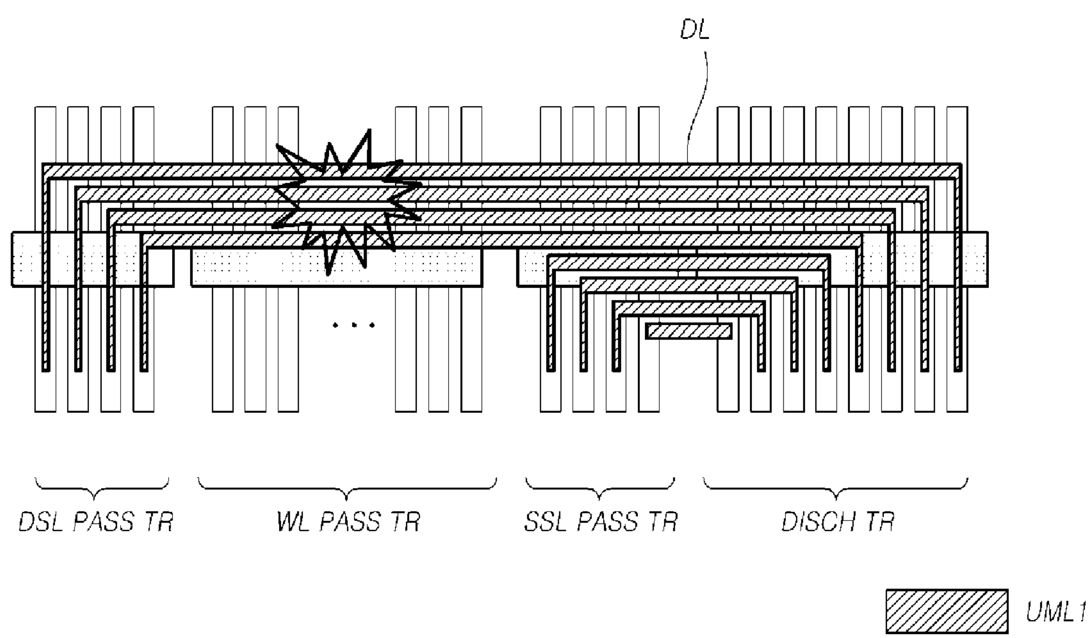
FIGS. 10 to 12 are layout diagrams illustrating memory devices that differ from the devices of present disclosure.
Figure 11:
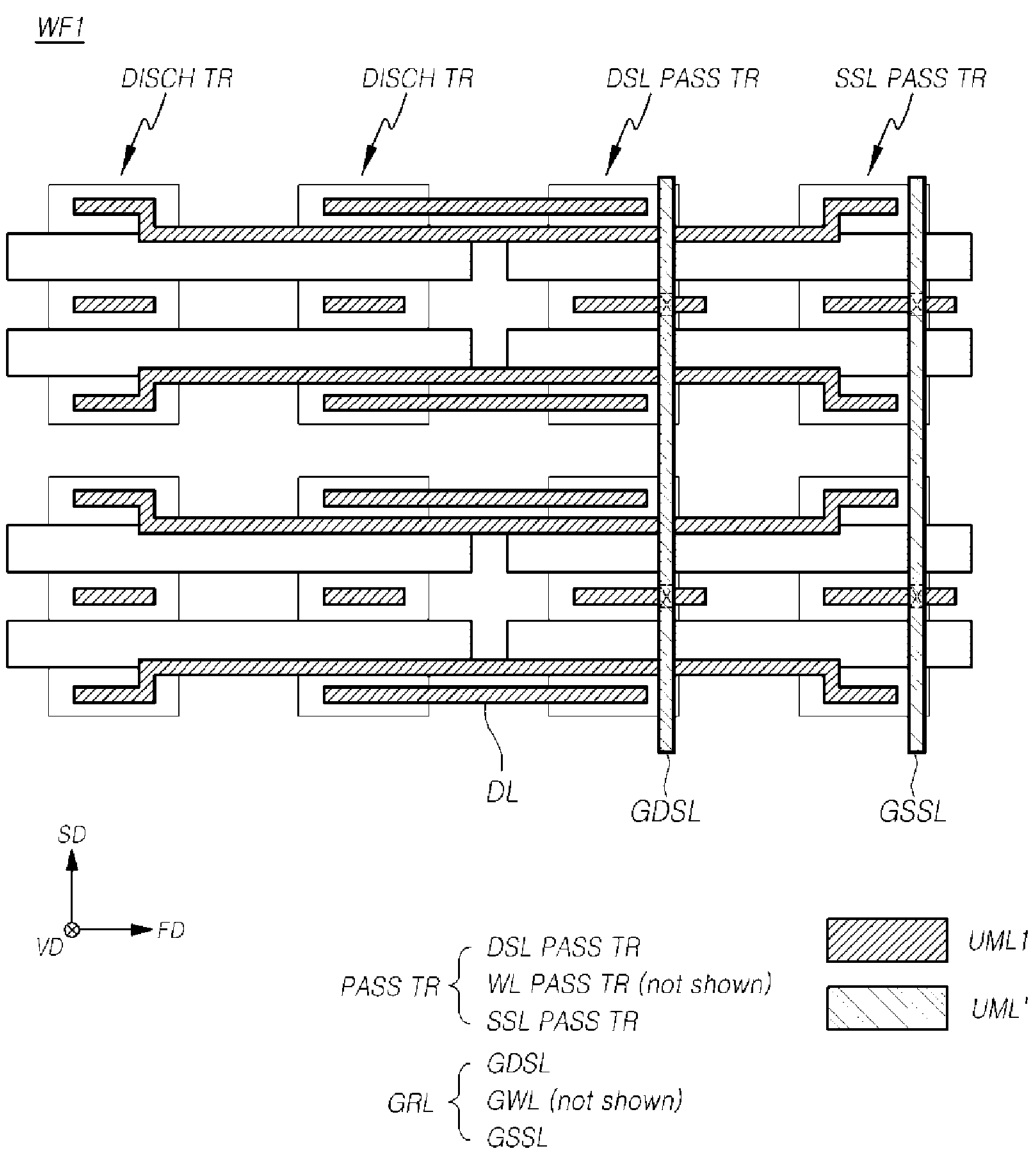
Figure 12:
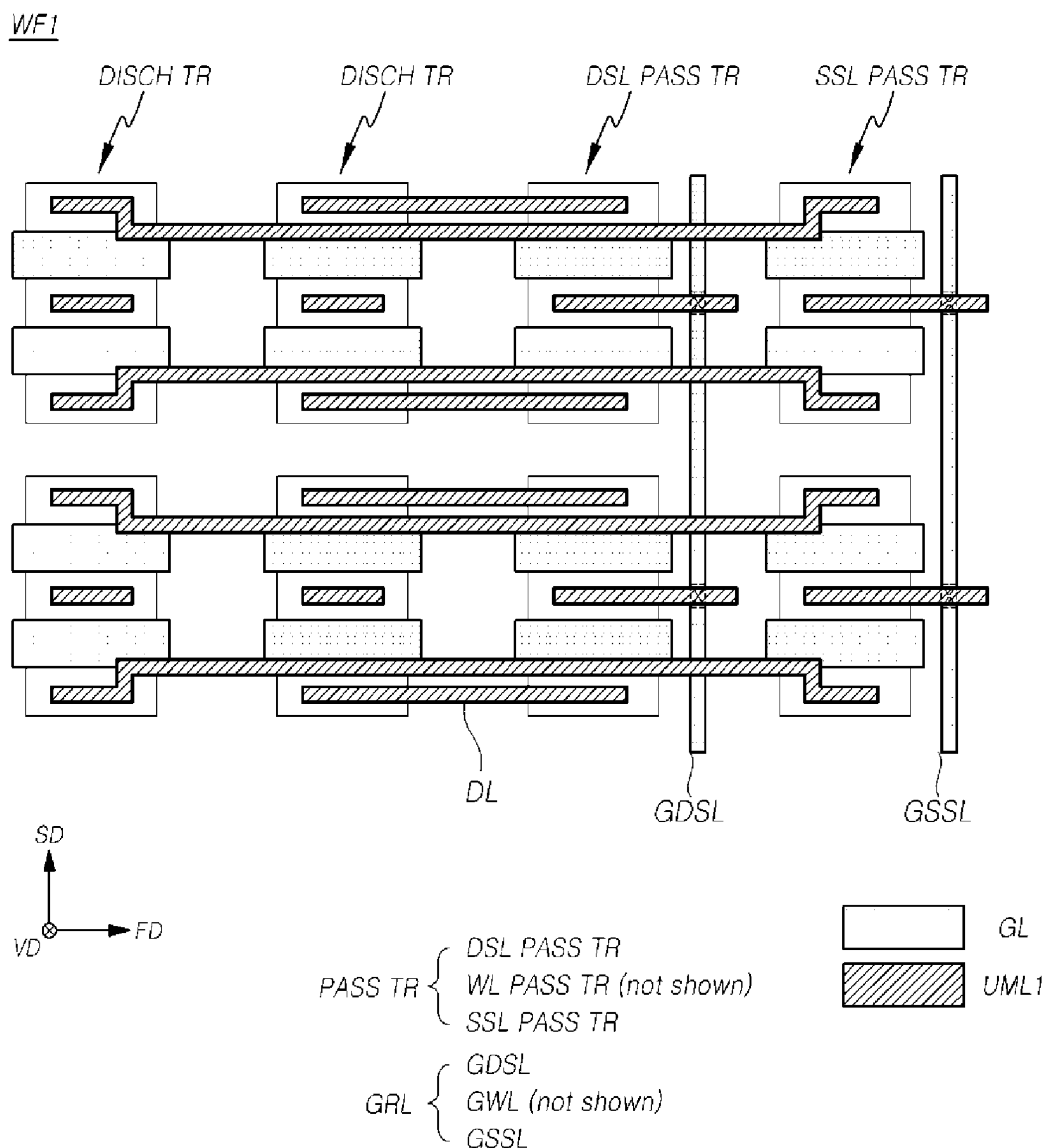

FIGS. 10 to 12 are layout diagrams illustrating memory devices that differ from devices of the present disclosure.

Referring to FIG. 10, discharge transistors DISCH TR may be disposed in a first wafer WF1 together with first pass transistors DSL PASS TR and SSL PASS TR and second pass transistors WL PASS TR. In order to couple the first pass transistors DSL PASS TR and SSL PASS TR and the discharge transistors DISCH TR, the discharge lines DL must be configured to extend in both the first direction FD and the second direction SD in the first wiring layer UML1.

However, since a plurality of global row lines (not illustrated) coupled to the first pass transistors DSL PASS TR and SSL PASS TR and the second pass transistors WL PASS TR are disposed in the first wiring layer UML1, it is difficult to configure the discharge lines DL to avoid the global row lines.

To solve the above-mentioned problem, as illustrated in FIG. 11, an additional wiring layer UML' may be formed in the first wafer WF1, and the global row lines GRL may be disposed in the additional wiring layer UML'. However, in this case, as the number of process steps increases, a manufacturing time and a manufacturing cost increase, as does the probability of the occurrence of a failure during a manufacturing process increases.

As another alternative method, as illustrated in FIG. 12, the global row lines GRL may be configured in a gate layer GL that is used to implement the gates of the pass transistors PASS TR and the discharge transistors DISCH TR. In order to secure the reliability of the pass transistors PASS TR and the discharge transistors DISCH TR, the gate layer GL should be formed of polysilicon. Since the resistivity of polysilicon is higher than that of a metallic material configuring the first wiring layer UML1, when the global row lines GRL are configured in the gate layer GL, the signal transmission speed of the global row lines GRL may decrease, thereby degrading the performance of the memory device.

Referring again to FIGS. 4 to 9, according to embodiments of the present disclosure, by disposing the pass transistor circuit 121 in the first wafer WF1 and disposing the discharge transistor circuit 122 in the second wafer WF2, which overlaps with the first wafer WF1 in the vertical direction VD, it is possible to configure the discharge lines DL coupling the pass transistor circuit 121 and the discharge transistor circuit 122 to be routed in the vertical direction VD. Accordingly, because it is possible to minimize a layout area occupied by the discharge lines DL, it is possible to dispose the discharge lines DL and the global row lines GRL without increasing a layout area and the number of wiring layers. Accordingly, since it is not necessary to form an additional wiring layer, a manufacturing time and a manufacturing cost may be reduced, and the occurrence of a failure during a manufacturing process may be reduced, thereby improving the yield. In addition, since it is not necessary to form the global row lines GRL in a gate layer, problems caused when the global row lines GRL are formed in the gate layer, that is, a decrease in the signal transfer speed of the global row lines GRL and a resultant degradation in the performance of the memory device, may be prevented.

Figure 13:
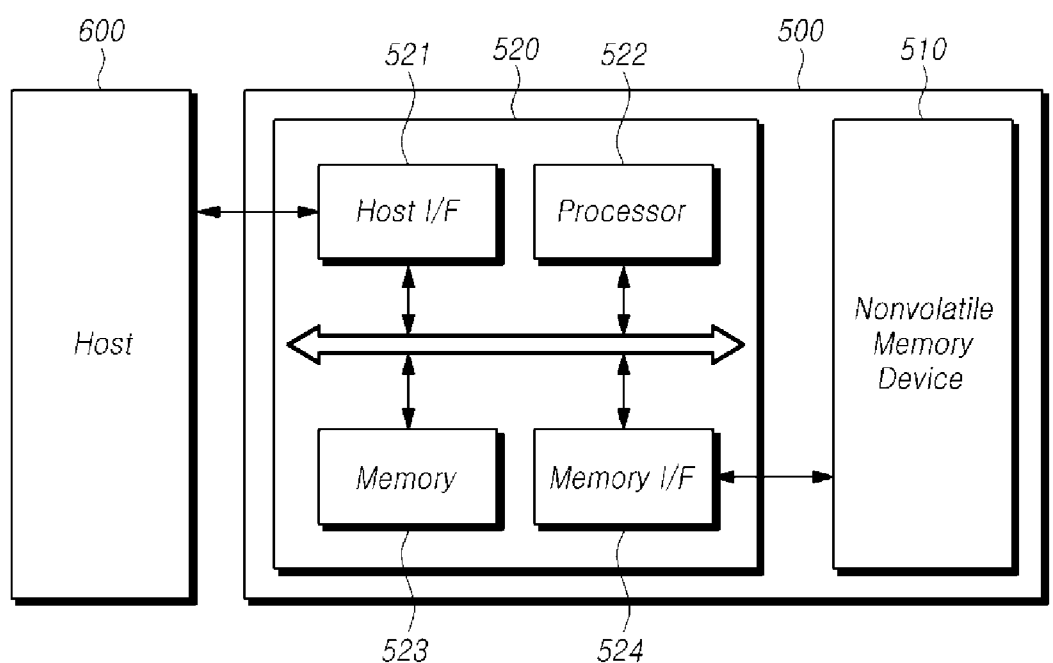
FIG. 13 is a block diagram schematically illustrating a memory system including a memory device according to the present disclosure.

FIG. 13 is a block diagram schematically illustrating a memory system including a memory device in accordance with an embodiment of the present disclosure.

Referring to FIG. 13, a memory system 500 may store data to be accessed by a host 600 such as a mobile phone, an MP3 player, a laptop computer, a desktop computer, a game player, a TV, an in-vehicle infotainment system, and so forth.

The memory system 500 may be manufactured as any one of various kinds of storage devices according to the protocol of an interface, which is electrically coupled to the host 600. For example, the memory system 500 may be configured as any one of various kinds of storage devices such as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, a memory stick, and so forth.

The memory system 500 may be manufactured as any one among various kinds of package types. For example, the memory system 500 may be manufactured as any one of various kinds of package types such as a package-on-package (POP), a system-in-package (SIP), a system-on-chip (SOC), a multi-chip package (MCP), a chip-on-board (COB), a wafer-level fabricated package (WFP) and a wafer-level stack package (WSP).

The memory system 500 may include a nonvolatile memory device 510 and a controller 520.

The nonvolatile memory device 510 may operate as a storage medium of the memory system 500. The nonvolatile memory device 510 may be configured by any one of various types of nonvolatile memory devices, depending on the type of memory cells, such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PRAM) using a chalcogenide alloy, and a resistive random access memory (RERAM) using a transition metal compound.

While FIG. 13 illustrates that the memory system 500 includes one nonvolatile memory device 510, this is only for the sake of convenience in explanation, and the memory system 500 may include a plurality of nonvolatile memory devices. The present disclosure may be applied the same to the memory system 500 including a plurality of nonvolatile memory devices. The nonvolatile memory device 510 may include the memory device according to embodiments of the present disclosure.

The controller 520 may control general operations of the memory system 500 through driving of firmware or software loaded in a memory 523. The controller 520 may decode and drive a code type instruction or algorithm such as firmware or software. The controller 520 may be implemented in the form of hardware or in a combined form of hardware and software.

The controller 520 may include a host interface (Host I/F) 521, a processor 522, the memory 523 and a memory interface (Memory I/F) 524. Although not illustrated in FIG. 13, the controller 520 may further include an ECC (error correction code) engine, which generates a parity by ECC-encoding write data provided from the host 600 and ECC-decodes read data, read from the nonvolatile memory device 510, by using the parity.

The host interface (Host I/F) 521 may interface the host 600 and the memory system 500 in correspondence to the protocol of the host 600. For example, the host interface (Host I/F) 521 may communicate with the host 600 through any one of universal serial bus (USB), universal flash storage (UFS), multimedia card (MMC), parallel advanced technology attachment (PATA), serial advanced technology attachment (SATA), small computer system interface (SCSI), serial attached SCSI (SAS), peripheral component interconnection (PCI) and PCI express (PCI-E) protocols.

The processor 522 may be configured by a micro control unit (MCU) or a central processing unit (CPU). The processor 522 may process a request transmitted from the host 600. In order to process a request transmitted from the host 600, the processor 522 may drive a code type instruction or algorithm, that is, firmware, loaded in the memory 523, and may control the internal function blocks such as the host interface (Host I/F) 521, the memory 523 and the memory interface (Memory I/F) 524 and the nonvolatile memory device 510.

The processor 522 may generate control signals for controlling the operation of the nonvolatile memory device 510, on the basis of requests transmitted from the host 600, and may provide the generated control signals to the nonvolatile memory device 510 through the memory interface (Memory I/F) 524.

The memory 523 may be configured by a random access memory such as a dynamic random access memory (DRAM) or a static random access memory (SRAM). The memory 523 may store firmware to be driven by the processor 522. Also, the memory 523 may store data necessary for driving the firmware, for example, metadata. Namely, the memory 523 may operate as a working memory of the processor 522.

The memory 523 may be configured to include a data buffer for temporarily storing write data to be transmitted from the host 600 to the nonvolatile memory device 510 or read data to be transmitted from the nonvolatile memory device 510 to the host 600. In other words, the memory 523 may operate as a buffer memory. The memory 523 may receive and store map data from the nonvolatile memory device 510 when the memory system 500 is booted.

The memory interface (Memory I/F) 524 may control the nonvolatile memory device 510 under the control of the processor 522. The memory interface (Memory I/F) 524 may also be referred to as a memory controller. The memory interface (Memory I/F) 524 may provide control signals to the nonvolatile memory device 510. The control signals may include a command, an address, an operation control signal and so forth for controlling the nonvolatile memory device 510. The memory interface (Memory I/F) 524 may provide data, stored in the data buffer, to the nonvolatile memory device 510, or may store data, transmitted from the nonvolatile memory device 510, in the data buffer.

The controller 520 may further include a map cache (not illustrated) which caches map data referred to by the processor 522 among map data stored in the memory 523.

Figure 14:
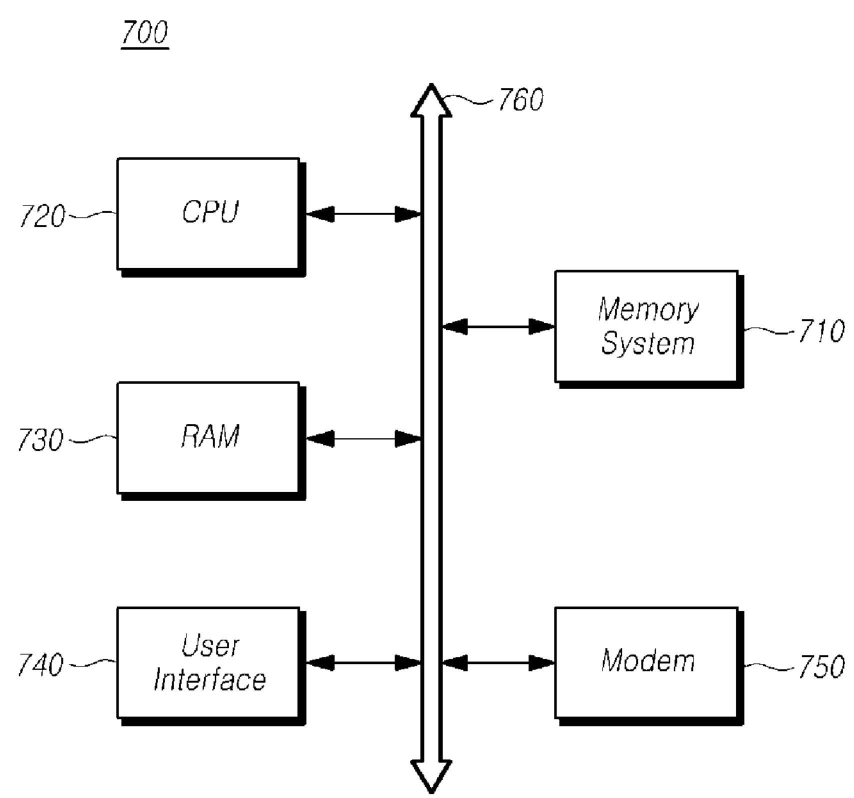
FIG. 14 is a block diagram schematically illustrating a computing system including a memory device in accordance with embodiments of the disclosure.

FIG. 14 is a block diagram schematically illustrating a computing system including a memory device in accordance with embodiments of the disclosure.

Referring to FIG. 14, a computing system 700 in accordance with an embodiment may include a memory system 710, a microprocessor (CPU) 720, a RAM 730, a user interface 740 and a modem 750 such as a baseband chipset, which are electrically coupled to a system bus 760. In the case where the computing system 700 in accordance with the embodiment is a mobile device, a battery (not shown) for supplying the operating voltage of the computing system 700 may be additionally provided. Although not shown in the drawing, it is obvious to a person skilled in the art to which the embodiment pertains that the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

Although exemplary embodiments of the disclosure have been described for illustrative purposes, those skilled in the art will appreciate that various modifications, additions and substitutions are possible, without departing from the scope and spirit of the disclosure. Therefore, the embodiments disclosed above and in the accompanying drawings should be considered in a descriptive sense only and not for limiting the technological scope. The technological scope of the disclosure is not limited by the embodiments and the accompanying drawings. The spirit and scope of the disclosure should be interpreted by the appended claims and encompass all equivalents falling within the scope of the appended claims.

What is claimed is:

1. A memory device comprising:

a pass transistor circuit included in a first wafer, and configured to transfer an operating voltage to row lines of a memory cell array; and a discharge transistor circuit included in a second wafer that overlaps with the first wafer in a vertical direction, and configured to transfer a discharge voltage to at least one of the row lines.

2. The memory device according to claim 1, wherein the discharge transistor circuit is disposed in a first region of the second wafer that overlaps with the pass transistor circuit in the vertical direction.

3. The memory device according to claim 1, wherein the discharge transistor circuit is coupled to the pass transistor circuit through a discharge line, and the discharge line is routed in the vertical direction.

4. The memory device according to claim 1, wherein the pass transistor circuit includes a plurality of pass transistors, and the discharge transistor circuit includes at least one discharge transistor, and a discharge transistor and a pass transistor that are coupled in common to one row line are disposed to overlap with each other in the vertical direction.

5. The memory device according to claim 4, further comprising:

a plurality of global row lines configured to transfer the operating voltage to the plurality of pass transistors; and a discharge line configured to couple the discharge transistor to a corresponding pass transistor, wherein the discharge line is disposed to overlap with one of the plurality of pass transistors in the vertical direction, and the plurality of global row lines do not overlap with the plurality of pass transistors in the vertical direction.

6. The memory device according to claim 1, wherein the first wafer further comprises:

a plurality of global row lines loaded with the operating voltage; and a plurality of coupling lines configured to couple the global row lines to the pass transistor circuit, wherein the plurality of global row lines and the plurality of coupling lines are disposed in a single wiring layer.

7. The memory device according to claim 1, wherein the second wafer further comprises:

a block selection circuit configured to control an operation of the pass transistor circuit, wherein the block selection circuit is disposed in a first region of the second wafer that overlaps with the pass transistor circuit in the vertical direction.

8. The memory device according to claim 7, wherein the second wafer further comprises:

a page buffer circuit disposed in a second region of the second wafer that overlaps with the memory cell array in the vertical direction, wherein the discharge transistor circuit is disposed in the first region of the second wafer, and is disposed closer to the page buffer circuit than the block selection circuit.

9. The memory device according to claim 1, wherein the first wafer includes a logic structure and a cell structure that overlaps with the logic structure in the vertical direction, and the pass transistor circuit is included in the logic structure, and the memory cell array is included in the cell structure.

10. A memory device comprising:

a pass transistor circuit included in a first wafer, and coupled to row lines of a memory cell array; and a discharge transistor circuit included in a second wafer that overlaps with the first wafer in a vertical direction and is coupled to the pass transistor circuit through at least one discharge line.

11. The memory device according to claim 10, wherein the discharge transistor circuit is disposed in a first region of the second wafer that overlaps with the pass transistor circuit in the vertical direction.

12. The memory device according to claim 10, wherein the discharge line is configured to be routed in the vertical direction.

13. The memory device according to claim 10, wherein the pass transistor circuit includes a plurality of pass transistors, and the discharge transistor circuit includes at least one discharge transistor, and the discharge transistor and a pass transistor corresponding thereto are coupled in common to one row line, and are disposed to overlap with each other in the vertical direction.

14. The memory device according to claim 13, further comprising:

a plurality of global row lines coupled to the plurality of pass transistors, wherein the discharge line is disposed to overlap with one of the plurality of pass transistors in the vertical direction, and the plurality of global row lines are disposed to not overlap with the plurality of pass transistors in the vertical direction.

15. The memory device according to claim 10, wherein the first wafer further comprises:

a plurality of global row lines; and a plurality of coupling lines configured to couple the plurality of global row lines to the pass transistor circuit, wherein the plurality of global row lines and the plurality of coupling lines are disposed in a single wiring layer.

16. The memory device according to claim 3, wherein the discharge line constitutes the shortest distance between the discharge transistor circuit and the pass transistor circuit.

17. The memory device according to claim 10, wherein the discharge line constitutes the shortest distance between the discharge transistor circuit and the pass transistor circuit.

* * * * *